United States Patent
Hanaoka (10) Patent No.: US 12,026,031 B2
(45) Date of Patent: Jul. 2, 2024

(54) POWER SUPPLY CONTROL APPARATUS AND TEMPERATURE CONTROL METHOD PERFORMING A COOLING CONTROL BASED ON AN ESTIMATED TEMPERATURE RISE VALUE BETWEEN FIRST AND SECOND THRESHOLD VALUES

(71) Applicant: Yazaki Corporation, Tokyo (JP)

(72) Inventor: Hiromichi Hanaoka, Makinohara (JP)

(73) Assignee: YAZAKI CORPORATION, Tokyo (JP)

( * ) Notice: Subject to any disclaimer, the term of this patent is extended or adjusted under 35 U.S.C. 154(b) by 190 days.

(21) Appl. No.: 17/833,267

(22) Filed: Jun. 6, 2022

(65) Prior Publication Data

US 2023/0010864 A1 Jan. 12, 2023

(30) Foreign Application Priority Data

Jul. 7, 2021 (JP) .................................. 2021-112931

(51) Int. Cl.
*G06F 1/3206* (2019.01)
*G06F 1/20* (2006.01)

(52) U.S. Cl.
CPC ............ *G06F 1/3206* (2013.01); *G06F 1/206* (2013.01)

(58) Field of Classification Search
CPC .................................................... G06F 1/3206
See application file for complete search history.

(56) References Cited

U.S. PATENT DOCUMENTS

| 2008/0068793 A1* | 3/2008 | Ishimine | H05K 7/20736 165/104.33 |
| 2009/0116189 A1* | 5/2009 | Chang | H05K 7/20909 361/695 |
| 2011/0080124 A1 | 4/2011 | Sasaki et al. | |
| 2012/0133313 A1* | 5/2012 | Xie | B60W 50/045 318/473 |
| 2022/0158582 A1* | 5/2022 | Fujikura | H02P 29/68 |

FOREIGN PATENT DOCUMENTS

| EP | 0832450 B1 | 1/2003 | |
| EP | 2296243 A1 | 3/2011 | |
| EP | 3299783 A1 * | 3/2018 | ............ G01K 7/427 |

(Continued)

*Primary Examiner* — Suresh Suryawanshi
(74) *Attorney, Agent, or Firm* — Sughrue Mion, PLLC (57) ABSTRACT

A power supply control apparatus controls a temperature of a device having a cooling mechanism and a heat generating component. The power supply control apparatus includes a nonvolatile storage unit that stores information indicating a specific characteristic including a thermal resistance and a thermal capacity of the device for each current of the heat generating component, a current measurement unit configured to measure a current flowing through the heat generating component, a temperature measuring unit configured to measure a current temperature of the heat generating component, and a control unit configured to perform cooling control on the device. The control unit estimates a temperature rise value after a certain delay time based on the current, the temperature, and the information on the specific characteristic, and performs the cooling control on the device based on an estimated temperature after the delay time.

7 Claims, 5 Drawing Sheets

(56) References Cited

FOREIGN PATENT DOCUMENTS

| | | | |
|---|---|---|---|
| JP | 7-322563 A | 12/1995 | |
| JP | 8-33104 A | 2/1996 | |
| JP | 2006-318354 A | 11/2006 | |
| JP | 2013252053 A * | 12/2013 | ............ G01K 3/005 |
| JP | 2015208081 A * | 11/2015 | |
| JP | 2018-88775 A | 6/2018 | |
| JP | 2018-180257 A | 11/2018 | |
| JP | 2018-207021 A | 12/2018 | |
| JP | 2020-88239 A | 6/2020 | |

* cited by examiner

POWER SUPPLY CONTROL APPARATUS AND TEMPERATURE CONTROL METHOD PERFORMING A COOLING CONTROL BASED ON AN ESTIMATED TEMPERATURE RISE VALUE BETWEEN FIRST AND SECOND THRESHOLD VALUES

CROSS-REFERENCE TO RELATED APPLICATIONS

This application is based on and claims priority under 35 USC 119 from Japanese Patent Application No. 2021-112931 filed on Jul. 7, 2021, the contents of which are incorporated herein by reference.

TECHNICAL FIELD

The present disclosure relates to a power supply control apparatus and a temperature control method.

BACKGROUND ART

For example, as for a device mounted on a vehicle, in recent years, there have been an increasing number of electrical components mounted with a semiconductor device that generates a large amount of heat when being energized. In addition, the device mounted on the vehicle is required to be smaller and lighter than devices in related art.

However, when an attempt is made to impart a sufficient cooling capacity to the device in order to avoid an adverse effect of a temperature rise due to the heat generation, a heat radiator (heat sink), a cooling fan, and the like increase a size and weight of the device. In addition, when the cooling capacity is insufficient, malfunction of the device is likely to occur due to an abnormal temperature rise.

For example, JP-A-2018-180257 discloses a temperature control method for an image monitoring apparatus. JP-A-2018-180257 discloses that when a measured temperature exceeds a set temperature, a current to be flowed through a cooling unit is adjusted.

On the other hand, JP-A-H08-33104 discloses a cooling method for an electric power conversion device for an electric vehicle. JP-A-H08-33104 discloses a technique for saving electric energy consumed for operations of a cooling fan and reducing noise of the cooling fan. JP-A-H08-33104 shows that a temperature Tfn of a heat radiation fan attached to a semiconductor element of the electric power conversion device that controls an electric motor for the electric vehicle, a current value Ia flowing through the element, and a voltage value Vdc are detected, a junction portion temperature Tjn of the semiconductor element is estimated, and a cooling wind speed is controlled when the junction portion temperature Tjn is equal to or lower than a maximum use set value Tjmax. A configuration of the device described in JP-A-H08-33104 includes a heat loss calculation circuit, a thermal resistance calculation circuit, and a thermal resistance-wind speed data table.

For example, it is possible to improve accuracy of temperature control by performing calculation in consideration of a heat loss and a thermal resistance as in JP-A-H08-33104. However, in actual temperature control, a time delay occurs from a time point when a control amount is changed to a time point when the changed control amount is reflected in an output temperature. Therefore, there is a tendency that excess or deficiency of the control amount occurs or a temperature change of a control result becomes large. In addition, there is an individual difference specific for each device in various apparatuses. Therefore, there is a possibility that performance of the temperature control varies due to an influence of the individual difference.

SUMMARY OF INVENTION

The present disclosure has been made in view of the above circumstances, and an object of the present disclosure is to provide a power supply control apparatus and a temperature control method capable of preventing temperature changes more than necessary and being less likely affected by individual differences among devices.

In order to achieve the above object, a power supply control apparatus according to the present disclosure is as follows. A power supply control apparatus for controlling a temperature of a device on which a cooling mechanism and a heat generating component that generates heat by being energized are mounted, the power supply control apparatus including: a nonvolatile storage unit that stores information indicating a specific characteristic including a thermal resistance and a thermal capacity of the device for each current of the heat generating component; a current measurement unit configured to measure a current I flowing through the heat generating component; a temperature measuring unit configured to measure a current temperature $T1$ of the heat generating component; and a control unit configured to perform cooling control on the device, in which the control unit estimates a temperature rise value $\Delta T2$ after a certain delay time $t2$ from a measurement of the current temperature $T1$ based on the current I measured by the current measurement unit, the temperature $T1$ measured by the temperature measuring unit, and the information on the specific characteristic stored in the nonvolatile storage unit, and performs the cooling control on the device based on an estimated temperature $T2$ after the delay time $t2$.

In order to achieve the above object, a temperature control method according to the present disclosure is as follows. A temperature control method for controlling a temperature of a device on which a cooling mechanism and a heat generating component that generates heat by being energized are mounted, the temperature control method including: calculating and storing information indicating a specific characteristic including a thermal resistance and a thermal capacity of the device for each current of the heat generating component in a calibration process; acquiring a current I flowing through the heat generating component and a current temperature $T1$ by measurement; estimating a temperature rise value $\Delta T2$ after a certain delay time $t2$ from a measurement of the current temperature $T1$ based on the stored thermal resistance and thermal capacity, and the acquired current I in an estimation process; and performing a cooling control based on an estimated temperature after the delay time $t2$, in which the calibration process is conducted before the estimation process.

According to the power supply control apparatus and the temperature control method of the present disclosure, it is possible to prevent temperature changes more than necessary while being less likely affected by individual differences among devices.

The present disclosure has been briefly described as above. Details of the present disclosure will be further clarified by reading an aspect for implementing the disclosure to be described below with reference to the accompanying drawings.

DESCRIPTION OF EMBODIMENTS

A specific embodiment according to the present disclosure will be described with reference to the drawings. In the following description, an example in which a power supply control apparatus according to the present disclosure is applied to a temperature control apparatus mounted on a vehicle will be described, but the present disclosure is not limited to this example, and can be applied to various power supply control apparatuses each having a switching function such as a DC/DC converter.

<Outline of Temperature Control Apparatus>
<Applications of Apparatus>

Figure 1:
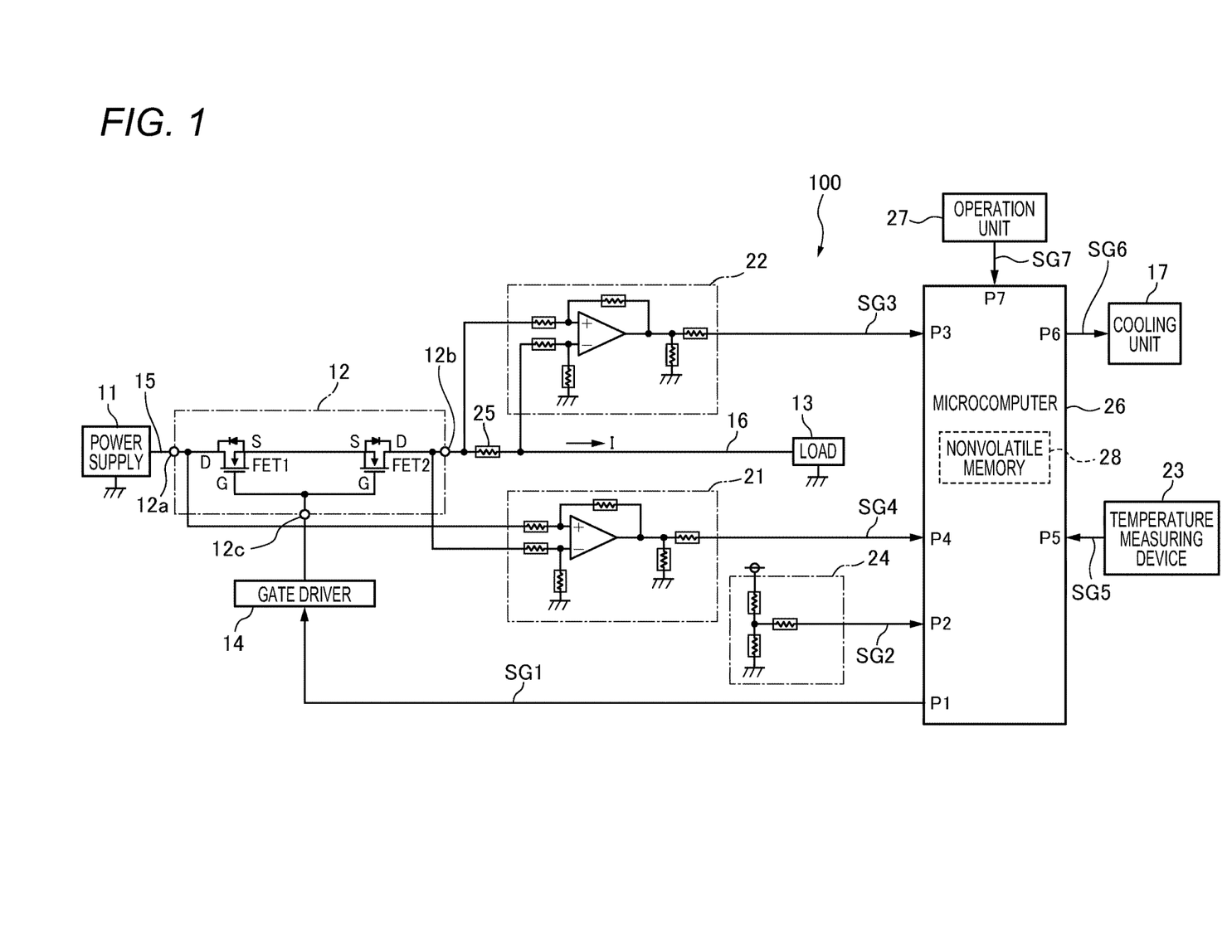
FIG. 1 is an electric circuit diagram showing a configuration example of a temperature control apparatus according to an embodiment of the present disclosure.

FIG. 1 shows a configuration example of a temperature control apparatus 100 (power supply control apparatus) according to the embodiment of the present disclosure.

The temperature control apparatus 100 shown in FIG. 1 can be used to implement control for efficiently cooling, in an appropriate state, an electrical component or the like having a component, such as various power semiconductor devices, that generates heat in accordance with an energization operation.

For example, when the power semiconductor device is energized, an electric power loss occurs due to an internal resistance thereof, and a temperature rises due to an influence of heat generation corresponding to the electric power loss. In addition, when the temperature rises abnormally, there is a high possibility that a malfunction occurs or a failure occurs in a component such as the semiconductor, and thus it is necessary to stop the abnormal temperature rise by cooling.

As a general cooling method, a heat radiator (heat sink) is used. In addition, in many cases, the cooling is forcibly performed by using an electric fan or a Peltier element. That is, by rotating the electric fan to blow air, it is possible to perform the cooling in accordance with an air blowing amount. In addition, by energizing the Peltier element, a vicinity of a heat source can be cooled.

However, when a cooling capacity is improved more than necessary, a large heat radiator and a large electric fan are required. In addition, high speed rotation of the electric fan increases electric power consumption, and noise caused by air blowing noise, mechanical vibration, or the like is likely to be generated. In addition, the Peltier element consumes a large amount of electric power. In particular, in a case of a device mounted on a vehicle, reduction in size, weight reduction, reduction in the electric power consumption, and the like are required, and thus it is very important to implement sufficient cooling performance without increasing a size of an outer shape, weight, electric power consumption, and the like of a cooling mechanism.

<Configuration of Temperature Control Apparatus 100>

The temperature control apparatus 100 shown in FIG. 1 implements a control function for maintaining a temperature rise, within an appropriate range, due to an influence of heat generation generated at a portion of a switching circuit 12. In addition, the temperature control apparatus 100 performs temperature control based on data specific for each device that is obtained by calibration to be described later. However, when the specific data determined in advance is stored in a nonvolatile memory 28 or the like, the temperature control apparatus 100 does not need the calibration. Therefore, functions and constituent components required only for the calibration do not necessarily have to be mounted on the temperature control apparatus 100.

In FIG. 1, a device (controlled device) to be controlled by the temperature control apparatus 100 includes a power supply 11, the switching circuit 12, a load 13, and a gate driver 14, for example. The load 13 corresponds to, for example, a motor, a lamp for illumination, a heater, or the like mounted on the vehicle.

In this controlled device, DC power-supply electric power supplied from the power supply 11 is supplied to the load 13 through a power supply line 15, an input terminal 12a, a switching circuit 12, an output terminal 12b, a resistor 25, and a current path 16.

The switching circuit 12 includes two semiconductor switch elements FET1, FET2 connected in series in a state of polarities reverse to each other. The semiconductor switch elements FET1, FET2 are power MOS field effect transistor (FET) devices.

That is, a drain terminal (D) of the semiconductor switch element FET1 is connected to the input terminal 12a, and a source terminal (S) of the semiconductor switch element FET1 and a source terminal (S) of the semiconductor switch element FET2 are connected to each other. A drain terminal (D) of the semiconductor switch element FET2 is connected to the output terminal 12b.

By applying an electric signal SG1, which is a binary signal, to gate terminals (G) of the semiconductor switch elements FET1, FET2 via the gate driver 14, the semiconductor switch elements FET1, FET2 can be switched between ON (conductive) and OFF (non-conductive). That is, conductive/non-conductive between the input terminal 12a and the output terminal 12b in the switching circuit 12 can be switched by the electric signal SG1.

When the switching circuit 12 is in a conductive state, a current I flows through the current path 16, and the power-supply electric power is supplied to the load 13. When the switching circuit 12 is in a non-conductive state, the current I is cut off, and thus the electric power supplied to the load 13 is cut off. Further, for example, when ON/OFF of the switching circuit 12 is controlled by pulse width modulation (PWM), a magnitude (effective value) of the current I can be adjusted.

Meanwhile, in order to be capable of measuring of the current I in the switching circuit 12 of the controlled device, the resistor 25 and an amplifier 22 are provided. A resistance value of the resistor 25 is very small to such an extent that the current I is not affected. The amplifier 22 detects a voltage drop due to the current I flowing through the resistor 25 and generates an amplified electric signal SG3.

Further, an amplifier 21 is provided to detect a potential difference between the input terminal 12a and the output terminal 12b of the switching circuit 12. The amplifier 21 detects the potential difference without affecting operations of the switching circuit 12, and generates an electric signal SG4 corresponding to this potential difference.

Meanwhile, in the controlled device, an electric power loss is generated inside the semiconductor switch elements FET1, FET2 by energization of the switching circuit 12, and heat is generated. That is, the semiconductor switch elements FET1, FET2 serve as heat sources, and a temperature rises. In order to prevent this temperature rise, a cooling unit 17 is provided. The cooling unit 17 includes a cooling mechanism capable of performing active control, such as the electric fan or the Peltier element, in addition to a heat radiator to be described later.

A heat source temperature measuring device 24 includes a sensor capable of detecting a temperature, such as a thermistor, and can detect a temperature in a vicinity of the semiconductor switch elements FET1, FET2 which are the heat sources. The heat source temperature measuring device 24 generates an electric signal SG2 indicating the detected temperature.

A temperature measuring device 23 detects a temperature at a position slightly away from the heat source. Specifically, a temperature of an outer surface of the heat radiator that cools the semiconductor switch elements FET1, FET2 is detected. In the present embodiment, for example, a measuring device capable of performing non-contact measurement, such as a radiation thermometer, is employed as the temperature measuring device 23. The temperature measuring device 23 generates an electric signal SG5 indicating information on the detected temperature.

The temperature control apparatus 100 shown in FIG. 1 is controlled by a control unit 26. In the present embodiment, a microcomputer is used as the control unit 26. The control unit 26 incorporates the nonvolatile memory 28.

The control unit 26 can switch the ON/OFF of the switching circuit 12 by controlling the electric signal SG1 output from a port P1. The electric signal SG2 output from the heat source temperature measuring device 24 is input to a port P2 of the control unit 26. The electric signal SG3 output from the amplifier 22 is input to a port P3 of the control unit 26. The electric signal SG4 output from the amplifier 21 is input to a port P4 of the control unit 26.

The control unit 26 can sequentially sample analog levels of the electric signals SG2 to SG4 respectively input to the ports P2 to P4 and convert the analog levels into digital signals to acquire information of the respective signals. In addition, the control unit 26 can acquire information of the electric signal SG5 output from the temperature measuring device 23 through, for example, communication at a port P5.

In addition, the control unit 26 can control a state of the cooling unit 17 by an electric signal SG6 output to a port P6. That is, the cooling unit 17 can be controlled by the electric signal SG6 so as to promote the cooling, and the cooling unit 17 can be controlled by the electric signal SG6 so as to prevent the cooling.

An operation unit 27 connected to a port P7 of the control unit 26 can receive an instruction by a user's switch operation. The control unit 26 can perform control such as mode switching in accordance with the instruction from the operation unit 27.

Example of Control Target

Figure 2:
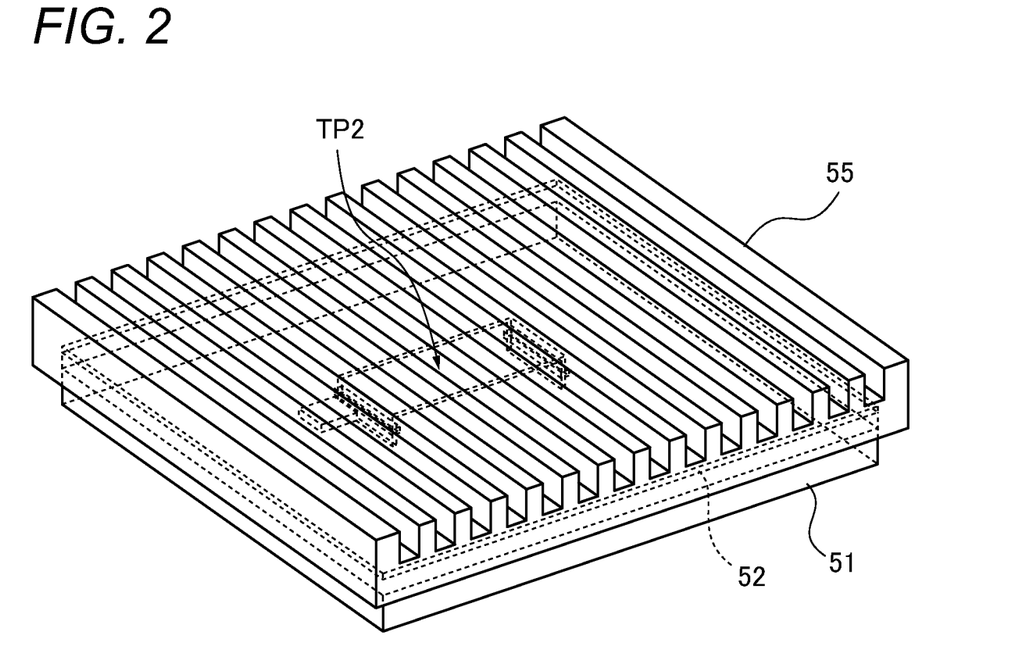
FIG. 2 is a perspective view showing a state in which a heat radiator is attached in a vicinity of a heat source to be cooled.
Figure 3:
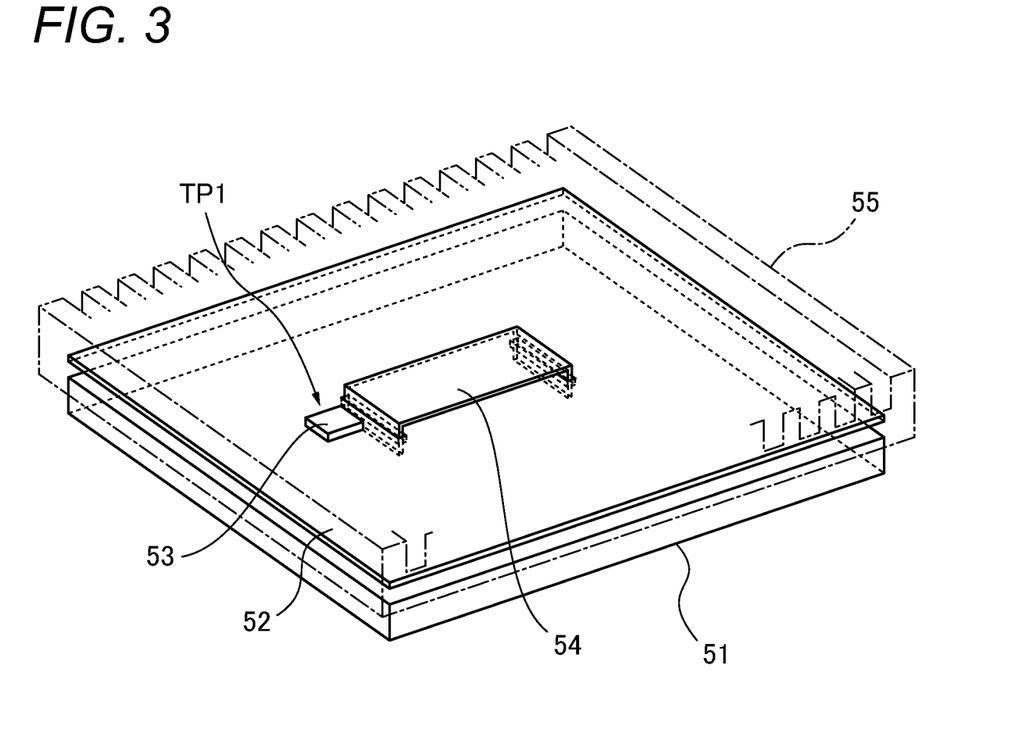
FIG. 3 is a perspective view showing a state in which the heat radiator is detached from the vicinity of the heat source to be cooled.

Examples of an external appearance of the vicinity of the heat source to be cooled are shown in FIGS. 2 and 3. FIG. 2 shows a state in which the heat radiator is attached, and FIG. 3 shows a state in which the heat radiator is detached.

In a device to be cooled (to be controlled), for example, as shown in FIG. 3, a circuit board 52 is installed on a housing 51, and a heat source 53 is attached to the circuit board 52. The heat source 53 corresponds to the semiconductor switch elements FET1, FET2 in FIG. 1. The heat source temperature measuring device 24 shown in FIG. 1 is installed at a position in which a temperature in a vicinity of the heat source 53 can be measured, that is, at a temperature measurement point TP1.

Heat generated by energization of the heat source 53 is transferred to a bus bar 54 made of metal by heat conduction, and is further transferred from the bus bar 54 to a heat radiator 55 by the heat conduction. In order to implement sufficient cooling performance, the heat radiator 55 shown in FIG. 2 has a sufficient size, and has a large number of fins in order to increase an area of a surface that can be further brought into contact with outside air.

Further, the sufficient cooling performance cannot be obtained only by natural air cooling using the heat radiator 55. Therefore, by air blowing using the electric fan included in the cooling unit 17 shown in FIG. 1, air coming into contact with the surface of the heat radiator 55 is forced to flow, thereby improving the cooling performance. Further, by increasing a rotation speed of the electric fan, an amount of air blown per unit time can be increased, and the cooling performance of the entire cooling unit 17 including the heat radiator 55 and the electric fan can be improved.

The temperature measuring device 23 shown in FIG. 1 measures a temperature of a temperature measurement point TP2 shown in FIG. 2. That is, a surface temperature of the heat radiator 55 is measured in a vicinity of a center of the outer surface of the heat radiator 55. The temperature measuring device 23 is used only at the time of calibration, which will be described later, and is not used in subsequent actual cooling control.

<Calibration Process>

Figure 4:
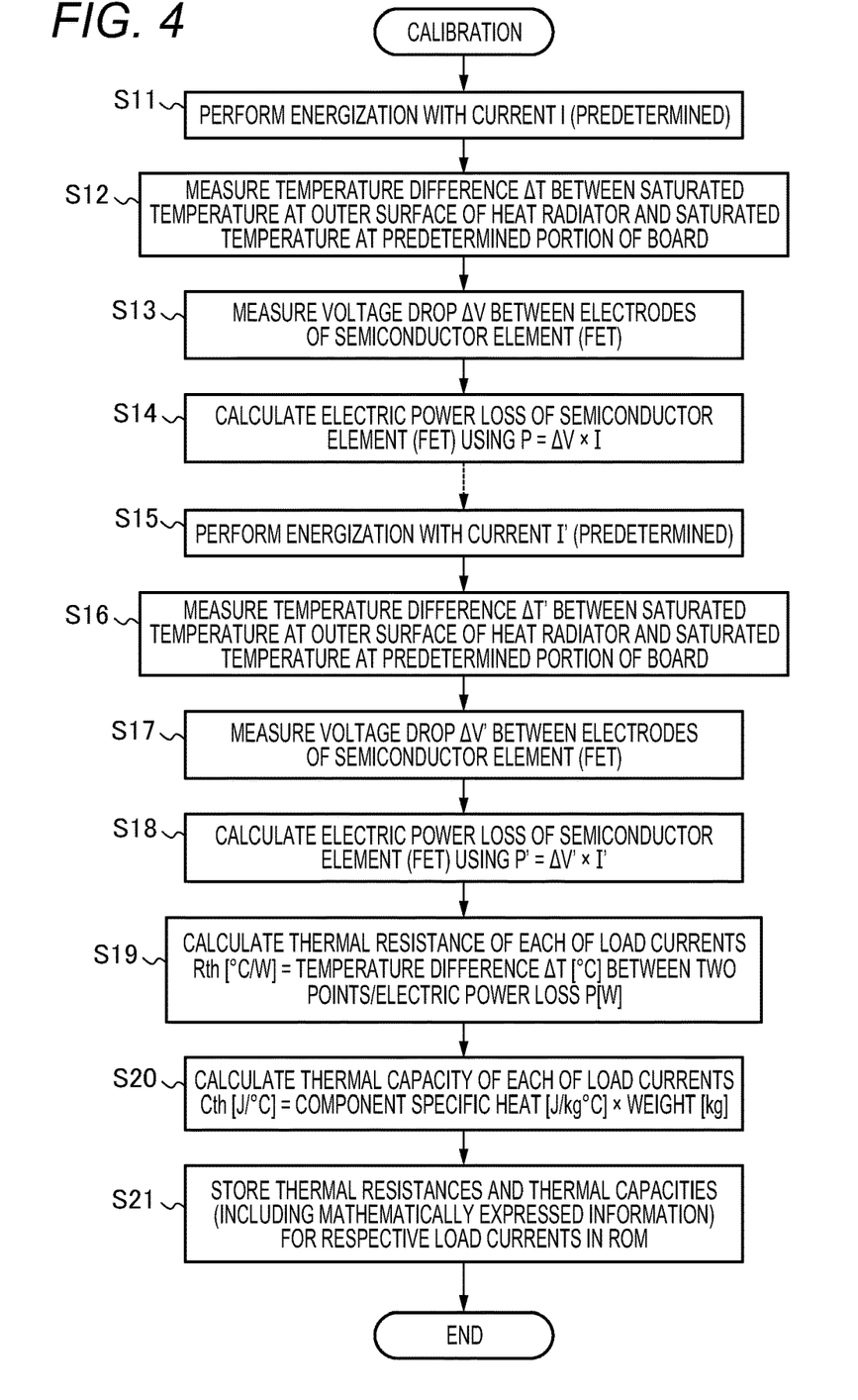
FIG. 4 is a flowchart showing a specific example of a calibration process of the temperature control apparatus.

Contents of a calibration process of the temperature control apparatus 100 are shown in FIG. 4. That is, in order to acquire data indicating a characteristic specific for the device to be cooled (to be controlled), the control unit 26 of the temperature control apparatus 100 shown in FIG. 1 executes the calibration process shown in FIG. 4.

For example, when the user operates the operation unit 27, a mode switching instruction is given to the control unit 26, and the calibration process of FIG. 4 can be started by executing a program incorporated in advance. The contents of this process will be described below.

The control unit 26 first controls the electric signal SG1, and performs energization control in S11, so that the current I flows through the switching circuit 12 with a first predetermined value (i1). Under this control, the current I having the first predetermined value i1 flows from the power supply 11 to the load 13 through the semiconductor switch elements FET1, FET2 in the switching circuit 12.

In the next S12, the control unit 26 simultaneously measures the temperatures at the two points by respectively using the heat source temperature measuring device 24 and the temperature measuring device 23, and detects a temperature difference ΔT (i1) between the two points corresponding to the current I having the first predetermined value i1.

When the calibration is performed, it is necessary to eliminate an influence of a transient change in temperature unrelated to a static characteristics specific for the device, and thus the measurement is performed in a state in which the temperature is saturated and stable. That is, the measurement of S12 is performed in a state in which a sufficient time elapses after a change of the current I and the temperature is sufficiently stable.

The control unit 26 observes a voltage of the electric signal SG4 in the next S13. As a result, the potential difference ΔV between an input and an output of the switching circuit 12 is detected. The potential difference ΔV detected in S13 is associated with the first predetermined value i1 of the current I.

Based on the current I corresponding to the first predetermined value i1 and the potential difference ΔV obtained in S13, the control unit 26 calculates an electric power loss P (i1) in the switching circuit 12 by the following equation in S14.

$$P(i1) = \Delta V \times I \quad (1)$$

Next, in S15, the control unit 26 changes a control amount of the electric signal SG1, and performs the energization control, so that the current I flows through the switching circuit 12 with a second predetermined value (i2). Therefore, the current I having the second predetermined value i2 flows from the power supply 11 to the load 13 through the semiconductor switch elements FET1, FET2 in the switching circuit 12.

In the next S16, the control unit 26 simultaneously measures the temperatures at the two points by respectively using the heat source temperature measuring device 24 and the temperature measuring device 23, and detects a temperature difference ΔT (i2) between the two points corresponding to the current I having the second predetermined value i2. In addition, as in the case of S12, the measurement of S16 is performed in the state in which the sufficient time elapses after the change of the current I and the temperature is sufficiently stable.

The control unit 26 observes the voltage of the electric signal SG4 again in the next S17. As a result, the potential difference ΔV between an input and an output of the switching circuit 12 is detected. The potential difference ΔV detected in S17 is associated with the second predetermined value i2 of the current I.

Based on the current I corresponding to the second predetermined value i2 and the potential difference ΔV obtained in S17, the control unit 26 calculates an electric power loss P (i2) in the switching circuit 12 by the following equation in S18.

$$P(i2) = \Delta V \times I \quad (2)$$

The control unit 26 respectively calculates device-specific thermal resistances Rth [° C./W] for various values of the current I in S19 based on results obtained in the processes of S11 to S18.

$$Rth(I) = \Delta T(I)/P(I) \quad (3)$$

In S20, the control unit 26 calculates device-specific thermal capacities Cth [J/° C.] for the values of the current I, respectively.

Specifically, a specific heat is obtained based on a function of a heat storage using the following equations (4), (5), and the thermal capacity Cth is calculated.

$$\Delta T1 = (Rth \times P) \times \mathrm{EXP}(-t1/(Rth \times Cth))) \quad (4)$$

$$Cth = K1 \times K2 \quad (5)$$

ΔT1: risen heat source temperature [° C.] after a predetermined current is flowed for a predetermined time
Rth: thermal resistance [° C./W] calculated when a predetermined current is flowed
P: electric power loss [W] calculated when a predetermined current is flowed
T1: predetermined time [sec]
K1: specific heat [J/kg° C.] of a component K2: weight (predetermined) [kg] of a component (heat radiator, board)
EXP ( ): exponential function with the inside of parentheses as a parameter The control unit 26 writes data including the device-specific thermal resistances Rth and the thermal capacities Cth for the various values of the current I to the nonvolatile memory 28 or a predetermined ROM (read-only memory) based on the results obtained in the processes of S11 to S19.

Example of Characteristics

Figure 5:
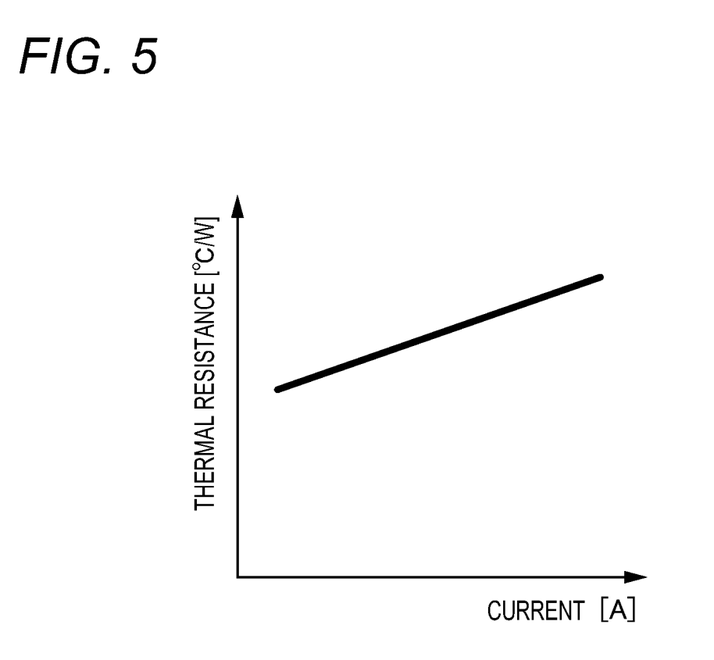
FIG. 5 is a graph showing an example of a correspondence relationship between a current and a thermal resistance.

FIG. 5 shows an example of a correspondence relationship between the current I flowing through the semiconductor switch elements FET1, FET2 of the switching circuit 12 and the thermal resistance Rth that affects temperature change characteristics when cooling a portion where the semiconductor switch elements FET1, FET2 serve as the heat source.

In the example shown in FIG. 5, it is assumed that the relationship between the current I and the thermal resistance Rth is linear. When the characteristic is linear as described above, as in steps S11 to S18 shown in FIG. 4, if the thermal resistances Rth for the two types of predetermined current values i1, i2 can be specified, thermal resistances Rth corresponding to other current values can also be easily calculated by the calculation in S19. That is, the thermal resistance Rth corresponding to each current value can be obtained based on a difference between any current value and the current value i1, or i2 and the slope of the change in the thermal resistance Rth.

Even when the change in the thermal resistance Rth is not linear, the thermal resistance Rth for any current value can be estimated by the calculation by repeating the same processes as S11 to S18 in FIG. 4 for each of three or more types of predetermined current values.

<Temperature Control Operation>

Figure 6:
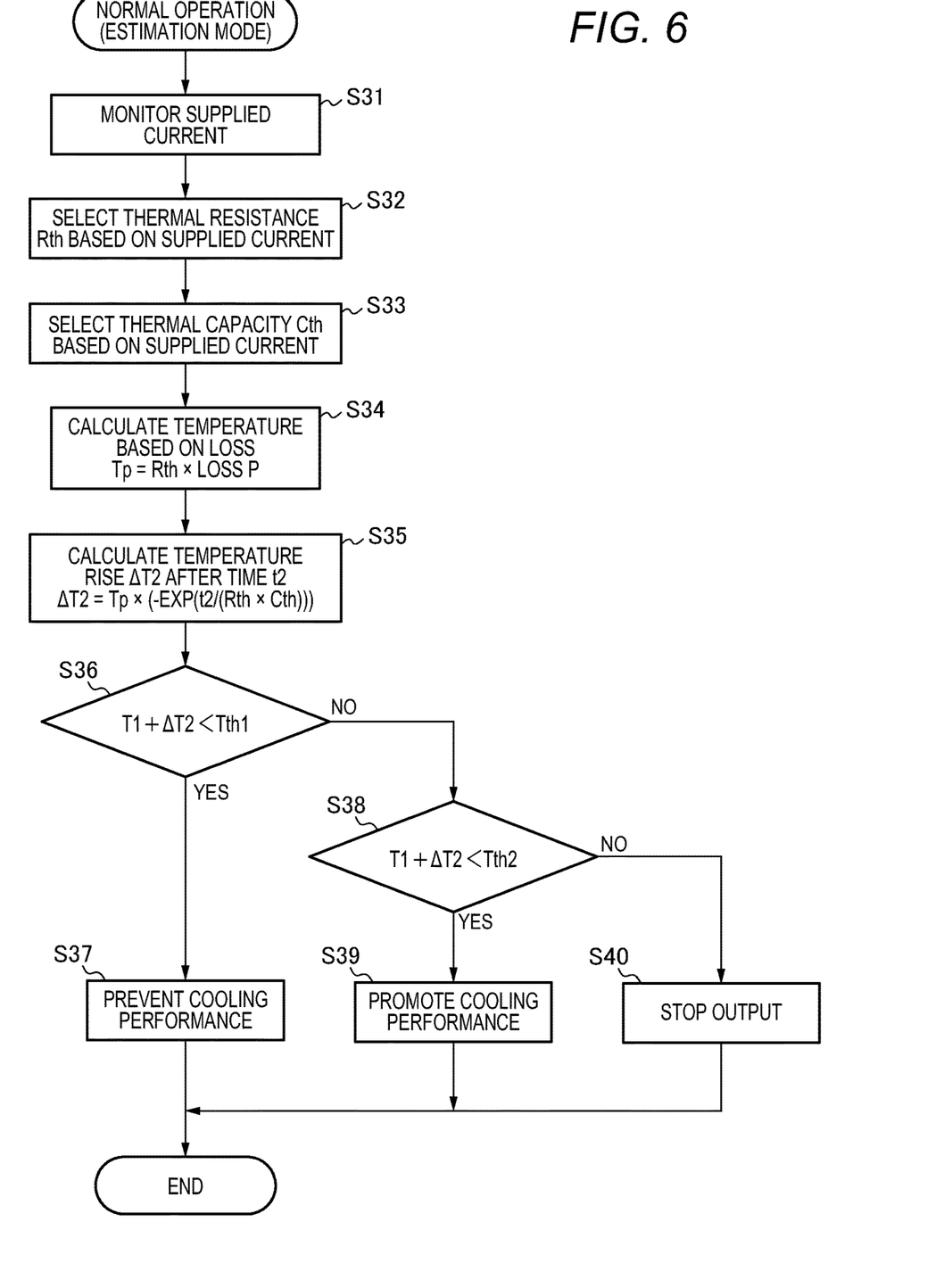
FIG. 6 is a flowchart showing an example of a temperature control operation of the temperature control apparatus.

An example of a temperature control operation in the temperature control apparatus 100 is shown in FIG. 6. In the temperature control apparatus 100 that performs the operation shown in FIG. 6, the device-specific data obtained as a result of the calibration shown in FIG. 4 is stored in advance in, for example, the nonvolatile memory 28 shown in FIG. 1.

That is, the data of the thermal resistance Rth and the thermal capacity Cth corresponding to each of various current values of the current I flowing through the switching circuit 12 is stored in the nonvolatile memory 28. Therefore, the control unit 26 can perform temperature control using the data of the thermal resistance Rth and the thermal capacity Cth in the nonvolatile memory 28.

In the present embodiment, constant data of a delay time t2 required for the temperature control shown in FIG. 6 and constant data Tth1, Tth2 indicating the two types of temperature thresholds are also determined in advance and stored in the nonvolatile memory 28.

Here, the constant data of the delay time t2 indicates a length of a delay time of the temperature control in which the temperature in the vicinity of the heat source falls below a maximum temperature at which destruction of the device or a functional failure occurs, and the cooling control in which the operation can be guaranteed. The delay time t2 is determined by the cooling performance specific for the apparatus.

The constant data Tth1 is a threshold indicating a temperature [° C.] in the vicinity of the heat source where cooling performance improving control in the cooling unit 17 is required.

The constant data Tth2 is a threshold indicating a temperature [° C.] in the vicinity of the heat source exceeding the cooling performance of the cooling unit 17 or a temperature at which the cooling control cannot be followed and heat generation needs to be prevented or stopped.

Therefore, there is a relationship of "Tth1<Tth2".

In the temperature control apparatus 100 shown in FIG. 1, for example, a user performs a predetermined input operation using the operation unit 27, so that an instruction for switching to an "estimation mode" can be given to the control unit 26. When a mode is switched to the "estimation mode", the control unit 26 executes a process of a normal operation shown in FIG. 6 as the "estimation mode". The normal operation in FIG. 6 will be described below.

In order to monitor the current value of the current I flowing through the switching circuit 12 in S31, the control unit 26 sequentially samples the electric signal SG3 and reads a voltage thereof. The control unit 26 acquires the data of the thermal resistance Rth corresponding to the current value acquired in S31 from the nonvolatile memory 28 (S32). Further, the control unit 26 acquires the data of the thermal capacity Cth corresponding to the current value acquired in S31 from the nonvolatile memory 28 (S33).

The control unit 26 samples the electric signal SG4 and acquires a voltage value thereof as the potential difference ΔV. The potential difference ΔV is a difference in voltage between the input and the output of the switching circuit 12. Then, the control unit 26 calculates a loss P [W] of the switching circuit 12 as a product of the potential difference ΔV and the value of the current I acquired in S31.

$$P = \Delta V \times I \quad (6)$$

Further, the control unit 26 calculates a temperature rise value Tp corresponding to the loss P in S34 at a present time.

$$Tp = Rth \times P \quad (7)$$

Next, the control unit 26 uses the delay time t2 of the constant data to calculate a temperature rise value ΔT2 at a time point after the delay time t2 elapses from the present time as an estimated value in S35.

$$\Delta T2 = Tp \times (-EXP(t2/(Rth \times Cth))) \quad (8)$$

The control unit 26 samples the latest electric signal SG2 and acquires this voltage value as the current temperature T1 of the heat source. Then, the estimated temperature T2 of the heat source at the time point after the delay time t2 elapses from the present time is calculated, and the estimated temperature T2 and the temperature threshold Tth1 are compared in S36.

$$T2 = T1 + \Delta T2 \quad (9)$$

When a condition of "T2<Tth1" is satisfied, the process proceeds from S36 to S37. In this case, since there is a margin in the current cooling state, the control unit 26 performs control so as to reduce the cooling performance of the cooling unit 17. Specifically, the rotation speed of the electric fan is decreased. This makes it possible to reduce the noise and electric power consumption.

When "T2≥Tth1", the process proceeds from S36 to S38, and the estimated temperature T2 is compared with the temperature threshold Tth2. When a condition of "Tth2>T2≥Tth1" is satisfied, the process proceeds from S38 to S39. In this case, since the current cooling performance is insufficient for an appropriate level, the control unit 26 performs control to improve the cooling performance of the cooling unit 17. Specifically, the rotation speed of the electric fan is increased.

When a condition of "T2≥Tth2" is satisfied, the process proceeds from S38 to S40. In this case, since a cooling capacity of the cooling unit 17 is exceeded or the cooling control cannot appropriately follow the temperature change of the heat source, the control unit 26 stops an output of the electric signal SG1 in S40 so as to cut off the energization of the switching circuit 12. It should be noted that the control may be performed in S40 so as to prevent the energization of the switching circuit 12.

<Advantages of Temperature Control Apparatus>

According to the temperature control apparatus 100 described above, by performing the calibration process shown in FIG. 4, it is possible to acquire the specific data, such as the thermal resistance Rth, for each current value in the actual device to be cooled. As long as this data is stored in advance in the nonvolatile memory 28 or the like, the data can be used by the control unit 26 of the temperature control apparatus 100 to implement the temperature control with high accuracy in the estimation mode shown in FIG. 6.

In addition, in the operation of the estimation mode shown in FIG. 6, the temperature rise value ΔT2 and the estimated temperature T2 in the future after the delay time t2 elapses from the present time are calculated, and the results of comparing the estimated temperature T2 with the thresholds Tth1, Tth2 are reflected in the control. Therefore, it is possible to prevent an occurrence of a delay in the temperature control.

<Supplementary Explanation>

Here, characteristics of the embodiment of the power supply control apparatus and a temperature control method according to the present disclosure described above are summarized briefly in the following [1] to [4].

[1] A power supply control apparatus (temperature control apparatus 100) for controlling a temperature of a device on which a cooling mechanism and a heat generating component that generates heat by being energized are mounted, the power supply control apparatus including:

a nonvolatile storage unit (nonvolatile memory 28) that stores information indicating a specific characteristic including a thermal resistance and a thermal capacity of the device for each current of the heat generating component;

a current measurement unit (resistor 25, amplifier 22) that measures a current I flowing through the heat generating component;

a temperature measuring unit (heat source temperature measuring device 24) that measures a current temperature T1 of the heat generating component; and     a control unit (26) that performs cooling control on the device,     in which the control unit estimates a temperature rise value ΔT2 after a certain delay time t2 from a measurement of the current temperature T1 based on the current I measured by the current measurement unit, the temperature T1 measured by the temperature measuring unit, and the information on the specific characteristic stored in the nonvolatile storage unit, and performs the cooling control on the device based on an estimated temperature T2 after the delay time t2 (S35 to S40).

According to the power supply control apparatus having the configuration of the above [1], since the control unit performs the control depending on the estimated temperature after the certain delay time t2 from a certain time point, it is possible to reduce an influence of a delay occurring in the actual temperature control, and the temperature control with high accuracy is implemented. In addition, since the information indicating the specific characteristic of each device is acquired from the nonvolatile storage unit, it is possible to reduce an error in control caused by an individual difference of the device to be controlled.

[2] The power supply control apparatus according to above [1],
in which the control unit determines a first temperature threshold Tth1 and a second temperature threshold Tth2 being greater than the first temperature threshold Tth1, and calculates the estimated temperature T2 by adding the temperature rise value ΔT2 to the current temperature T1 (S36),
in which the control unit prevents cooling performed by the cooling mechanism in a case that the estimated temperature T2 is smaller than the first temperature threshold Tth1 (S37),
in which the control unit promotes the cooling performed by the cooling mechanism in a case that the estimated temperature T2 is equal to or greater than the first temperature threshold Tth1 and is smaller than the second temperature threshold Tth2 (S39), and
in which the control unit prevents energization of the heat generating component in a case that the estimated temperature T2 is equal to or greater than the second temperature threshold Tth2 (S40).

According to the power supply control apparatus having the configuration of above [2], it is possible to perform appropriate control in accordance with an actual temperature change of the device. That is, when the condition of "T2<Tth1" is satisfied, there is a high possibility that an actual temperature after the delay time t2 from the present time is maintained at the temperature threshold Tth2 or less even if the cooling is prevented. In addition, when the condition of "Tth1≤T2<Tth2" is satisfied, it is highly likely that the actual temperature after the delay time t2 from the present time is maintained at the temperature threshold Tth2 or less by promoting the cooling. In addition, when the condition of "T2≥Tth2" is satisfied, the control cannot be performed only by cooling, but by reducing a heat generation amount of the heat generating component, it is possible to avoid an abnormal increase in the actual temperature after the delay time t2 from the present time.

[3] The power supply control apparatus according to above [1] or [2],
in which the control unit detects a temperature difference ΔT between two points at different positions (S12),
in which the control unit calculates the thermal resistance based on the detected temperature difference ΔT, and
in which the control unit stores the thermal resistance in the nonvolatile storage unit (S19).

According to the power supply control apparatus having the configuration of above [3], since the temperature difference ΔT obtained by actual measurement is used, the thermal resistance can be calculated with high accuracy in a state in which an influence of the individual difference of the device can be compensated.

[4] A temperature control method for controlling a temperature of a device on which a cooling mechanism (cooling unit 17) and a heat generating component (semiconductor switch elements FET1, FET2) that generates heat by being energized are mounted, the temperature control method including:
in a calibration process (see FIG. 4) performed in advance, calculating and storing information indicating a specific characteristic of a thermal resistance (Rth) and a thermal capacity (Cth) of the device for each current of the heat generating component (S21);
acquiring a current I flowing through the heat generating component and a current temperature T1 by measurement (S31, S36);
estimating a temperature rise value ΔT2 after a certain delay time t2 based on the stored thermal resistance and thermal capacity, and the acquired current I (S35); and
reflecting an estimated temperature (T2) after the delay time t2 in cooling control (S36 to S40).

[5] The temperature control method according to above [4], further including:
calculating the estimated temperature (T2) by adding the temperature rise value (ΔT2) to the current temperature (T1);
preventing cooling performed by the cooling mechanism in a case that the estimated temperature (T2) is smaller than a first temperature threshold (Tth1);
promoting the cooling performed by the cooling mechanism in a case that the estimated temperature (T2) is equal to or greater than the first temperature threshold (Tth1) and is smaller than a second temperature threshold (Tth2); and
preventing energization of the heat generating component in a case that the estimated temperature (T2) is equal to or greater than the second temperature threshold (Tth2),
wherein the second temperature threshold (Tth2) is greater than the first temperature threshold (Tth1).

[6] The temperature control method according to above [4] or [5], further including:
detecting a temperature difference (ΔT) between two points at different positions to each other (S12);
calculating the thermal resistance based on the detected temperature difference (ΔT); and
storing the thermal resistance in the nonvolatile storage unit (S19).

According to the temperature control method of the procedure of the above [4], since the control can be performed depending on the estimated temperature after the certain delay time t2 from a certain time point, it is possible to reduce the influence of the delay occurring in the actual temperature control, and the temperature control with high accuracy is implemented. In addition, since the information indicating the specific characteristic of each device is obtained in the calibration process, it is possible to reduce an error in control caused by an individual difference of the device to be controlled.

What is claimed is:
1. A power supply control apparatus for controlling a temperature of a device on which a cooling mechanism and a heat generating component that generates heat by being energized are mounted, the power supply control apparatus comprising:
a nonvolatile storage unit that stores information indicating a specific characteristic including a thermal resistance and a thermal capacity of the device for each current of the heat generating component;
a current measurement unit configured to measure a current flowing through the heat generating component;
a temperature measuring unit configured to measure a current temperature of the heat generating component; and
a control unit configured to perform cooling control on the device based on determining at least whether a tem- perature rise value is between a first temperature threshold and a second temperature threshold, wherein the control unit estimates the temperature rise value after a certain delay time from a measurement of the current temperature based on the current measured by the current measurement unit, the temperature measured by the temperature measuring unit, and the information on the specific characteristic stored in the nonvolatile storage unit, and performs the cooling control on the device based on an estimated temperature after the delay time.

2. The power supply control apparatus according to claim 1, wherein the control unit determines the first temperature threshold and the second temperature threshold being greater than the first temperature threshold, and calculates the estimated temperature by adding the temperature rise value to the current temperature, wherein the control unit prevents cooling performed by the cooling mechanism in a case that the estimated temperature is smaller than the first temperature threshold, wherein the control unit promotes the cooling performed by the cooling mechanism in a case that the estimated temperature is equal to or greater than the first temperature threshold and is smaller than the second temperature threshold, and wherein the control unit prevents energization of the heat generating component in a case that the estimated temperature is equal to or greater than the second temperature threshold.

3. The power supply control apparatus according to claim 1, wherein the control unit detects a temperature difference between two points at different positions, wherein the control unit calculates the thermal resistance based on the detected temperature difference, and wherein the control unit stores the thermal resistance in the nonvolatile storage unit.

4. A temperature control method for controlling a temperature of a device on which a cooling mechanism and a heat generating component that generates heat by being energized are mounted, the temperature control method comprising:

calculating and storing information indicating a specific characteristic including a thermal resistance and a thermal capacity of the device for each current of the heat generating component in a calibration process;

acquiring a current flowing through the heat generating component and a current temperature by measurement;

estimating a temperature rise value after a certain delay time from a measurement of the current temperature based on the stored thermal resistance and thermal capacity, and the acquired current in an estimation process; and performing a cooling control based on determining an estimated temperature after the delay time and at least whether the temperature rise value is between a first temperature threshold and a second temperature threshold, wherein the calibration process is conducted before the estimation process.

5. The temperature control method according to claim 4, further comprising:

calculating the estimated temperature by adding the temperature rise value to the current temperature;

preventing cooling performed by the cooling mechanism in a case that the estimated temperature is smaller than the first temperature threshold;

promoting the cooling performed by the cooling mechanism in a case that the estimated temperature is equal to or greater than the first temperature threshold and is smaller than the second temperature threshold; and preventing energization of the heat generating component in a case that the estimated temperature is equal to or greater than the second temperature threshold, wherein the second temperature threshold is greater than the first temperature threshold.

6. The temperature control method according to claim 4, further comprising:

detecting a temperature difference between two points at different positions to each other;

calculating the thermal resistance based on the detected temperature difference; and storing the thermal resistance in the nonvolatile storage unit.

7. The power supply control apparatus according to claim 1, wherein the first temperature threshold represents a first temperature at the heat generating component and at which the cooling control is predetermined as being capable of being implemented, and wherein the second temperature threshold represents a second temperature at the heat generating component and at which the cooling control is predetermined as being incapable of being implemented.

* * * * *